United States Patent
Pathiyakkara Thombra et al.

(10) Patent No.: US 11,922,068 B2
(45) Date of Patent: Mar. 5, 2024

(54) NEAR MEMORY PROCESSING (NMP) DUAL IN-LINE MEMORY MODULE (DIMM)

(71) Applicant: SAMSUNG ELECTRONICS CO., LTD., Suwon-si (KR)

(72) Inventors: Eldho Mathew Pathiyakkara Thombra, Karnataka (IN); Ravi Shankar Venkata Jonnalagadda, Karnataka (IN); Prashant Vishwanath Mahendrakar, Karnataka (IN); Jinin So, Hwaseong-si (KR); Jong-Geon Lee, Seoul (KR); Vishnu Charan Thummala, Karnataka (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 23 days.

(21) Appl. No.: 17/666,212

(22) Filed: Feb. 7, 2022

(65) Prior Publication Data
US 2023/0185487 A1 Jun. 15, 2023

(30) Foreign Application Priority Data
Dec. 10, 2021 (IN) .............................. 202141057571

(51) Int. Cl.
G06F 3/06 (2006.01)
(52) U.S. Cl.
CPC .......... *G06F 3/0659* (2013.01); *G06F 3/0604* (2013.01); *G06F 3/0673* (2013.01)
(58) Field of Classification Search
CPC ..... G06F 3/0659; G06F 3/0604; G06F 3/0673
See application file for complete search history.

(56) References Cited

U.S. PATENT DOCUMENTS

| | | | | |
|---|---|---|---|---|
| 2018/0074965 A1* | 3/2018 | Aguilera Diez | .... | G06F 12/0862 |
| 2018/0284994 A1* | 10/2018 | Haller | ................ | G06F 12/0292 |
| 2019/0108145 A1* | 4/2019 | Raghava | ............ | G06F 13/1668 |
| 2020/0035291 A1 | 1/2020 | Kasibhatia et al. | | |
| 2021/0073622 A1 | 3/2021 | Yudanov et al. | | |
| 2021/0286740 A1* | 9/2021 | Dunning | ............ | G06F 13/1668 |
| 2022/0350771 A1* | 11/2022 | Ringe | ................ | G06F 13/4068 |
| 2022/0413849 A1* | 12/2022 | Jayasena | ............ | G06F 15/7821 |

OTHER PUBLICATIONS

First Office Action dated Dec. 22, 2022 In Corresponding Application No. DE 10 2022 107 525.7.
An Introduction to CCIX. White Paper. CCIK Consortium, Inc., 2019. URL: https://www.ccixconsortium.com/wp-content/uploads/2019/11/CCIX-White-Paper-Rev111219.pdf [abgerufen am Dec. 21, 2022].

\* cited by examiner

*Primary Examiner* — Edward J Dudek, Jr.
(74) *Attorney, Agent, or Firm* — F. Chau & Associates, LLC

(57) ABSTRACT

A Near Memory Processing (NMP) Dual In-line Memory Module (DIMM) is provided that includes random access memory (RAM), a Near-Memory-Processing (NMP) circuit and a first control port. The NMP circuit is for receiving a command from a host system, determining an operation to be performed on the RAM in response to the command, and a location of data within the RAM with respect to the determined operation. The first control port interacts with a second control port of the host system to enable the NMP circuit to exchange control information with the host system in response to the received command.

20 Claims, 12 Drawing Sheets

NEAR MEMORY PROCESSING (NMP) DUAL IN-LINE MEMORY MODULE (DIMM)

CROSS-REFERENCE TO RELATED APPLICATION

This U.S non-provisional patent application claims priority under 35 U.S.C. § 119 to Indian Patent Application No. 202141057571 filed on Dec. 10, 2021 in the India Property Office, the disclosure of which is incorporated by reference in its entirety herein.

TECHNICAL FIELD

The present subject matter relates to Dual In-line Memory Module (DIMM) and, in particular, relates to a near-memory processing DIMM.

DISCUSSION OF RELATED ART

A dual inline memory module (DIMM) refers to a type of computer memory that contains at least one random-access memory (RAM) chip on a small circuit board with pins that connect it to a computer motherboard. Operations may be performed on the DIMM using a memory controller integrated with the motherboard or by a central processing unit (CPU) connected to the motherboard. An important area of research is increasing system-level performance when data is processed near to memory, and such mechanism is referred to as near memory processing (NMP).

A processor located near the memory for the NMP may be referred to a an NMP core. A host may initiate a request to the NMP core using a virtual address. However, the NMP core is not able to convert the virtual address to a physical address and does not have access to a translation lookaside buffer (TLB), which may include a recent translation of the virtual address to the physical address. The NMP core may translate the virtual address with the help of a dedicated driver. However, this is inefficient and time consuming since the driver is not able to benefit from parallel execution by a memory management unit (MMU) or from the caching provided by the TLB. In other words, the NMP core remains dependent upon the drivers of a host system for address translation and other control instruction exchange.

SUMMARY

According to an embodiment of the disclosure, a Near Memory Processing (NMP) Dual In-line Memory Module (DIMM) includes a random access memory (RAM), a Near-Memory-Processing (NMP) circuit and a first control port. The NMP circuit is configured for receiving a command from a host system, determining an operation to be performed on the RAM in response to the command, and a location of data within the RAM with respect to the determined operation. The first control port interacts with a second control port of the host system to enable the NMP circuit to exchange control information with the host system in response to the received command.

In an embodiment, the host system corresponds to a processor executing a host application.

In an embodiment, the first control port includes a first connector connected through a physical wire to a second connector of the second control port.

In an embodiment, the second connector includes at least one of a host adapter connected through a standard connector to the host system and a port embedded within a motherboard of the host system.

In an embodiment, the first connector includes one or more pins provided in a DIMM interface, of the NMP DIMM.

In an embodiment, the first control port interacts with a second control port of the host system to enable the NMP circuit to perform a virtual to physical address translation.

In an embodiment, the first control port interacts with a second control port of the host system to enable the NMP circuit to interrupt the host system.

In an embodiment, the first control port interacts with a second control port of the host system to enable the NMP circuit to access data in cache-coherent manner by snooping a host system cache of the host system.

According to an embodiment of the disclosure, a method for performing an operation in a Near Memory Processing (NMP) Dual In-line Memory Module (DIMM) includes: a circuit of the NMP DIMM receiving a command from a host system; the circuit determining an operation to be performed on a random access memory (RAM) of the NMP DIMM and a location of data within the RAM with respect to the determined operation; a first control port of the circuit interacting with a second control port of the host system to enable the circuit to exchange control information with the host system in response to the received command.

The method may include the first control port interacting with the second control port to enable the circuit to perform a virtual to physical address translation.

The method may include the first control port interacting with the second control port to enable the circuit to interrupt the host system.

The method may include the first control port interacting with the second control port to enable the circuit to access data in a cache coherent manner by snooping a host system cache of the host system.

According to an embodiment of the disclosure, a Near Memory Processing (NMP) Dual In-line Memory Module (DIMM) includes a random access memory (RAM), a Near-Memory-Processing (NMP) circuit and a first control port. The circuit is for receiving a command and a virtual address from a host system, determining an operation to be performed on the RAM in response to the command, sending a request to the host system across the first port to a second port of the host system for a physical address mapped to the virtual address, receiving the physical address at the first port from the second port, and determining a location of data within the RAM using the received physical address.

BRIEF DESCRIPTION OF THE DRAWINGS

The above and other embodiments and features of the present disclosure will become more apparent by describing embodiments thereof with reference to the attached drawings, in which.

DETAILED DESCRIPTION OF THE EXEMPLARY EMBODIMENTS

Hereinafter, exemplary embodiments of the inventive concept will be explained in detail with reference to the accompanying drawings. As used herein, the singular forms, "a," "an" and "the" are intended to include the plural forms as well, unless the context clearly indicates otherwise.

Figure 1:
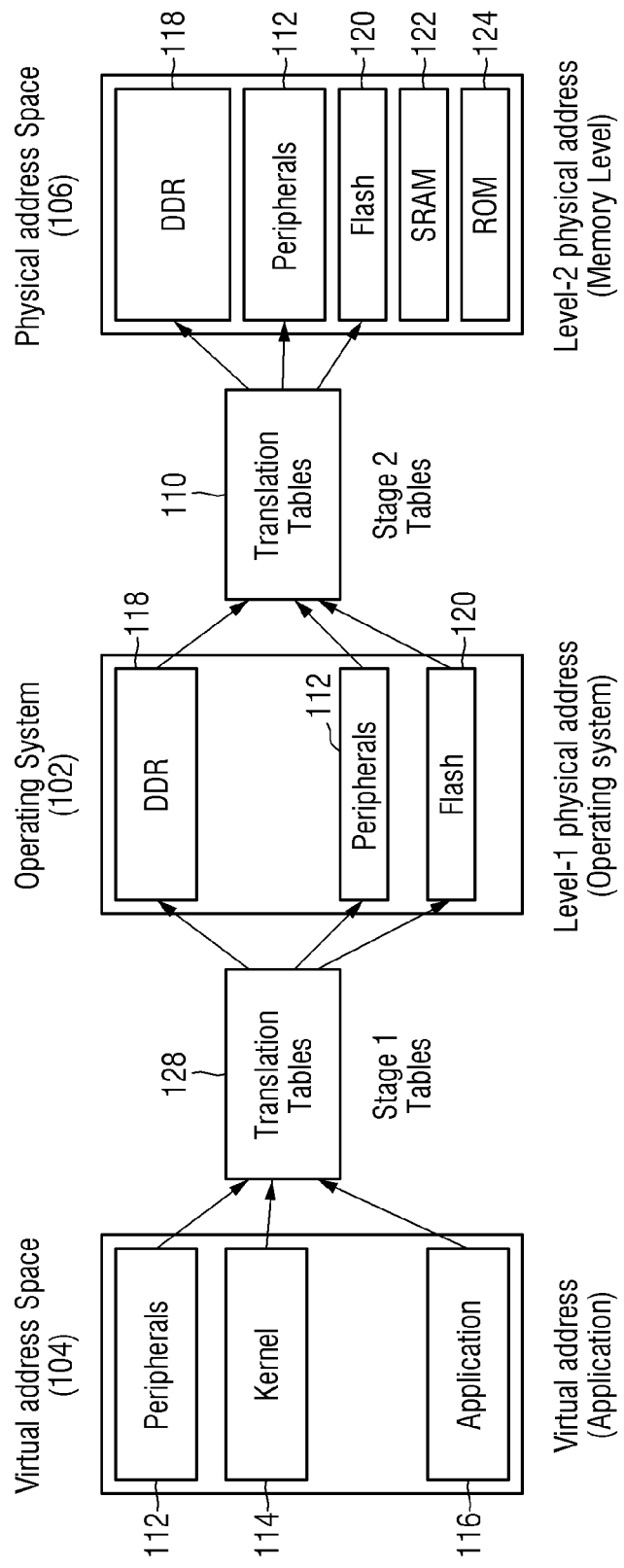
FIG. 1 illustrates a scenario pertaining to address translation.

FIG. 1 illustrates a computer system including an operating system 102, a virtual address space 104, and a physical address space 106. The computer system further includes first stage translation tables 108, second stage translation tables 110, peripherals 112, a kernel 114, an application 116, a double data rate (DDR) synchronous random-access memory (118), a flash memory (120), synchronous random-access memory (122), and a read-only memory (124). FIG. 1 illustrates an example of translation from a virtual address by the application 116 using a first level table 108 to a first level physical address for an operating system 102. The operating system 102 then converts the first level address to a second level physical address corresponding to an actual physical address within the memory.

More specifically, a traversal of multiple levels of mapping tables and obtaining of a final physical address may be performed by a Memory Management Unit (MMU) in association with a translation lookaside buffer (TLB) for a normal-access of a memory region. However, this proves to be a time-consuming operation when performed by a driver such as an application software to share the physical address with a hardware accelerator.

Figure 2:
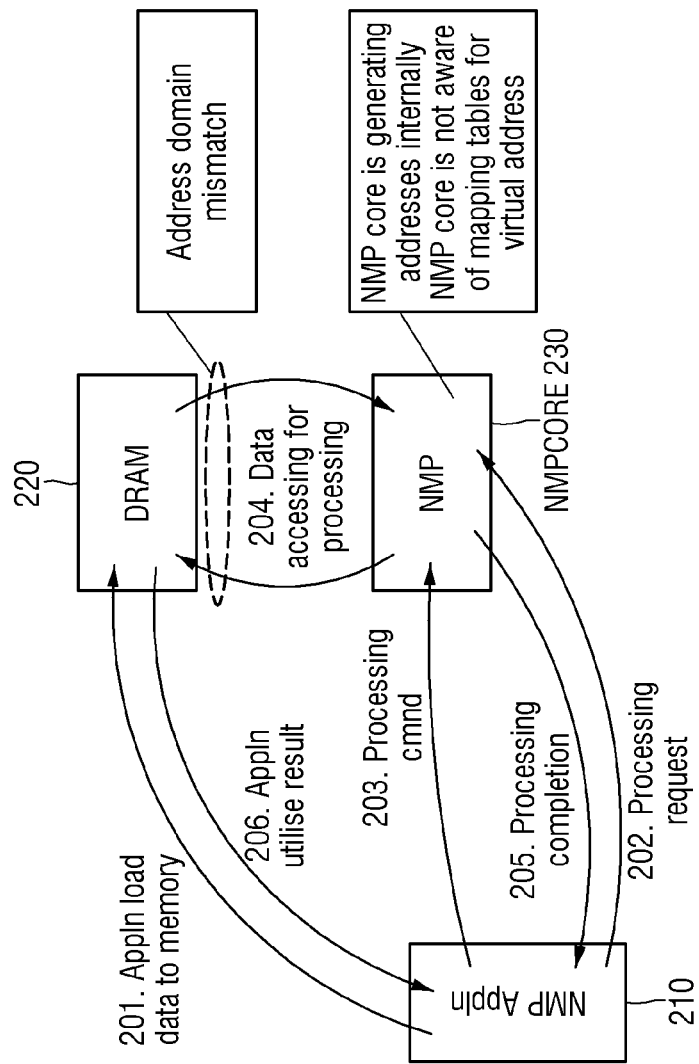
FIG. 2 illustrates a scenario pertaining to an NMP-DIMM.

In FIG. 2, an NMP application 210 loads data to a dynamic random-access memory 220 (step 201), a host initiates a request to an NMP core 230 with a virtual address (step 202), which passes as a command to a processing system within the NMP core (step 203). The processing system or NMP does not know about the physical addresses of data, and does not have any access to a TLB forming a part of a host system. As indicated in FIG. 2, the NMP core 230 is generating addresses internally. However, the NMP core is not aware of mapping tables for a virtual-address since the mapping table information is stored in the host memory, i.e. a host DRAM. Accordingly, there is an observed address domain mismatch. Further in FIG. 2, the NMP core 230 accesses the memory 220 to retrieve data for processing the request (step 204), the NMP core 230 may notify the NMP application 210 that processing of the request has completed (step 205), and then the NMP application 210 may utilize results of the processing (step 206).

Figure 3:
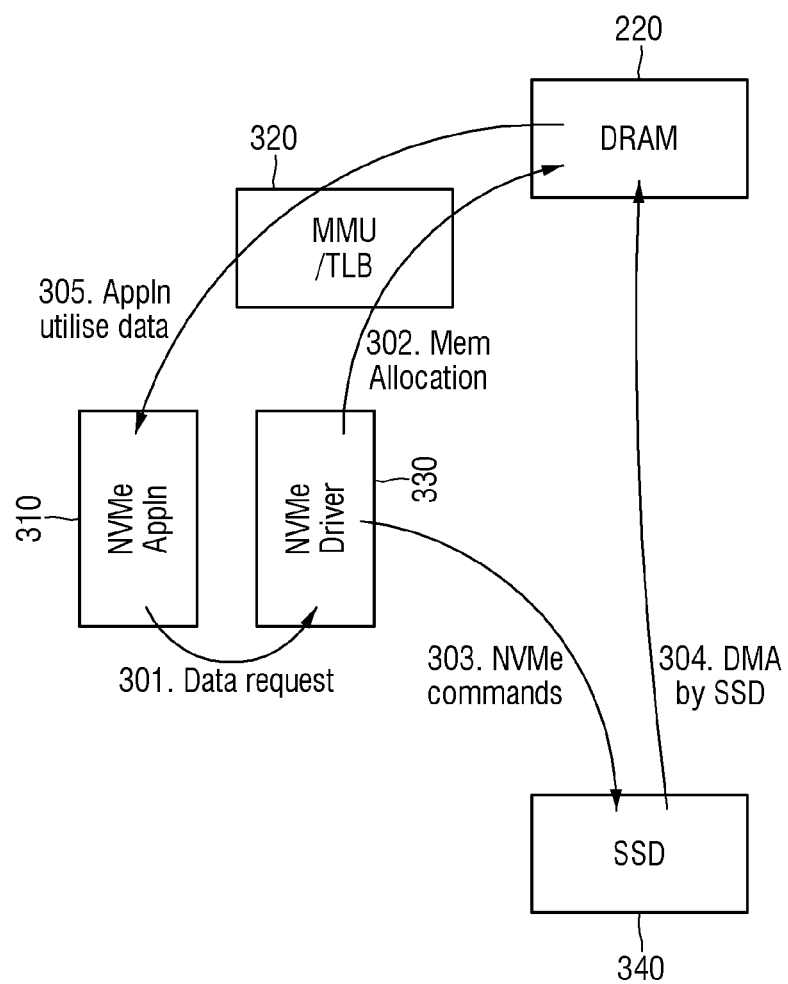
FIG. 3 illustrates a scenario pertaining to an NMVe system.

FIG. 3 illustrates a system including an NVMe application 310, an MMU/TLB 320, a NVMe driver 330, the DRAM 220, and a solid-state drive (SSD) 340. FIG. 3 illustrates the address translation required by the NMP core 230 of FIG. 2 being facilitated with the help of a dedicated driver (NVMe driver 330) for each address request. However, this leads to inefficiency as it is a time consuming task since the driver 330 is not able to use parallel execution of the MMU circuit or a caching advantage of the TLB. Accordingly, the operation of the driver 330 does not benefit the NMP core 230. In other words, the NMP core 230 remains dependent upon drivers of the host system for address translation and other control instruction exchange. In FIG. 3, the NVMe application 310 sends a data request to the NVMe driver 330 (step 301), the NVMe Driver 330 allocates memory for the data request (step 302), the NVMe Driver 330 applies NVMe commands to the SSD 340 (step 303), the SSD 340 performs a direct-memory-access (DMA) with the DRAM 220 in response to the NVMe comments (step 304) to retrieve data, and the NVMe application 310 utilizes the retrieved data (step 305).

Figure 4:
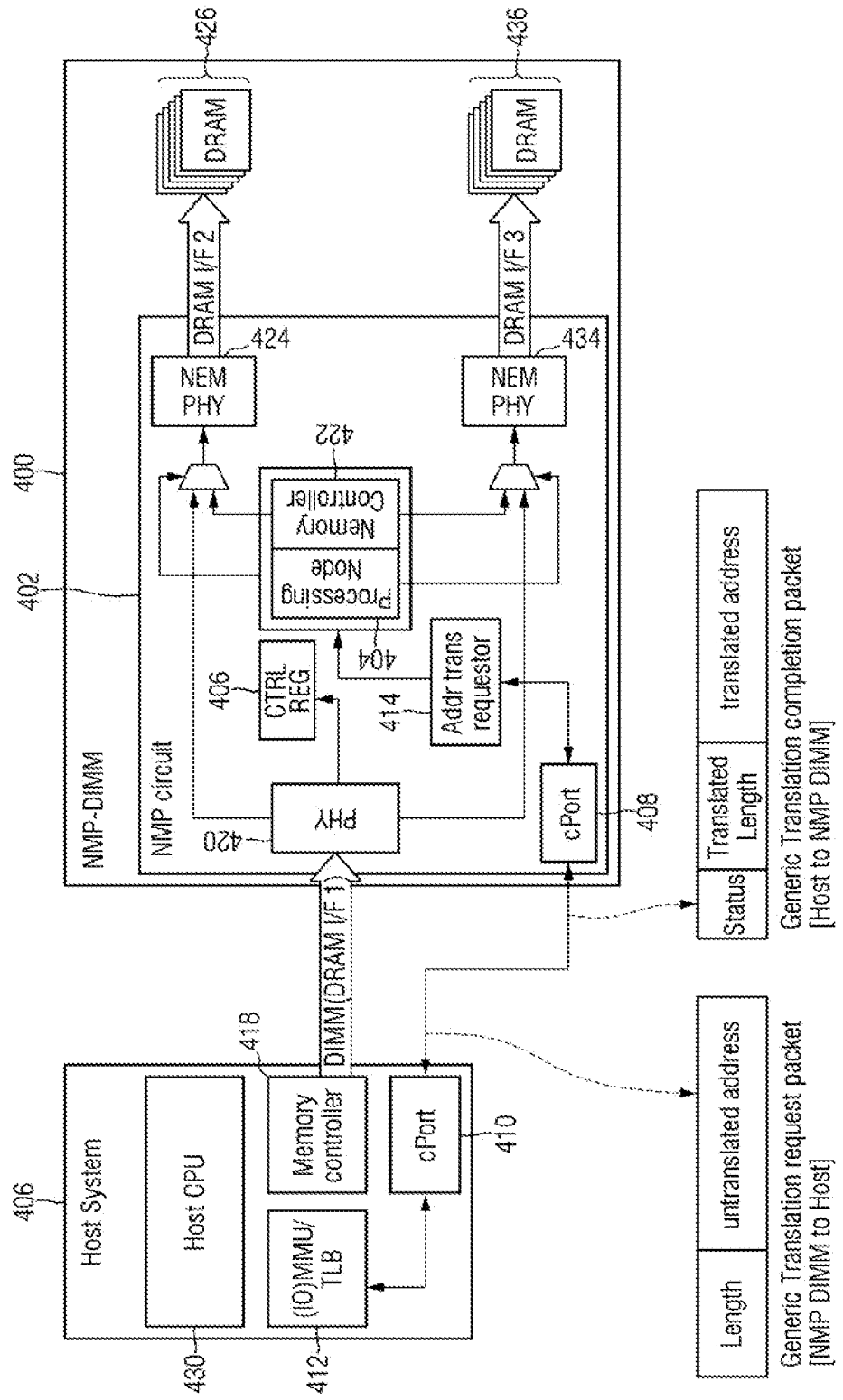
FIG. 4 illustrates a Near Memory Processing (NMP) Dual In-line Memory Module (DIMM) in accordance with an embodiment of the disclosure.

FIG. 4 illustrates a Near Memory Processing (NMP) Dual In-line Memory Module (DIMM) 400 based on random access memory (RAM) in accordance with an embodiment of present disclosure.

The NMP DIMM 400 includes a Near-Memory-Processing (NMP) circuit 402 including a first NMP node 404 (e.g., a first processor or first core) for receiving a command from a host system 406 through a control register (CTRL REG 406) and parsing the command. A second NMP node 404 (e.g., a second processor or second core) to determine operations to be performed and locations of data with respect to the parsed command. The first NMP node 404 and the second NMP node 404 may jointly correspond to an NMP processing system within the NMP circuit 402.

The NMP circuit 402 further includes a control port 408 interacting with the host system 406 and enabling the NMP circuit 402 to exchange control information with the host system 406 in response to the received command. For example, the control information may be used for address translations, interrupts, and/or cache snoop requests with the host system 406 in response to the received command. The control port 408 may be referred as a cPort. In an embodiment in accordance with FIG. 4, the control port 408 interacts with the host system 406 and enables the NMP circuit to perform a virtual to physical address translation. Accordingly, the NMP circuit 402 is able communicate with a TLB 412 at the host through a host controller forming a part of the host. In an embodiment, the NMP circuit 402 is configured to translate addresses for every page boundary through an address translator 414 (e.g., a logic circuit). Addresses are generated internally based on the processing request and a fast data processing may be achieved.

In an example, the control port 408 corresponds to external control port cPort (PCIe, CXL, CCIX etc.) on device (i.e. NMP-DIMM 400), though which the virtual to physical address translation can be achieved.

The host-system 406 may correspond to a processor executing a host application. Further, the control port 408 enables the NMP processing system and thereby the NMP circuit 402 to interact with the TLB 412 with the host system 406, and exchange control information with the host system 406 in response to the received command. In an embodiment, the control ports 408 and 410 corresponds to a physical wired connection between a first connector located at the NMP DIMM 400 side and a second connector attached to the host system 406. In an example, the first connector at the NMP DIMM 400 may be defined by one or more pins provided in a DIMM interface of the NMP DIMM 400. In an embodiment, the first connector is included within the control port 408 and the second connector is included within the control port 410.

In an embodiment, the first connector is a combination of a physical wire, a connector and an associated device controller present within an integrated circuit of the NMP DIMM 400. Such an on-chip device controller generates an address translation request based on a virtual address for communication to the host via a protocol chosen for the cPort communication.

The second connector may be defined by at least one of: a host adapter connected through a standard connector to the host system 406 as shown later in FIG. 10. In other example, the second connector may correspond to a port embedded within a motherboard of the host system as shown later in FIG. 11.

In an embodiment, the second connector includes a physical wire/connector and an associated host controller present within an integrated circuit of the host. The host controller communicatively requests the MMU and TLB (e.g., 112) to extract a physical-address of the requested virtual address for the NMP DIMM 400. Such a translated physical address is then communicated back to the NMP DIMM 400 using the cPort (e.g., 410 and 408).

Referring to FIG. 4, information is sent from the first Cport 408 to the MMU/TLB 412 via the second Cport 410 and from the MMU/TLB 412 to the first Cport 408 via Cport 410. The same enables the NMP circuit 402 to perform a virtual to physical address translation. An example of the information as request response data structure is depicted in FIG. 4. The host system 406 may send a translation request packet to the NMP-DIMM 400 and the NMP-DIMM 400 may response to the host system 406 with a translation completion packet. The translation request packet may include one or more untranslated addresses and a length. The untranslated address may be a virtual address received from the host system 406, which requires translation before data in memory can be accessed. The length may indicate an amount of address space that needs to be translated for NMP processing. The translation completion packet may include a translated address, a translated length, and a status. The translated address is the translated address after a successful translation. The translated length provides the amount of address space that was successfully translated. The status may indicate whether the translation was successful or unsuccessful. The translated address and the translated length may be ignored if the status indicates the translation was unsuccessful.

The Host System 406 may additionally include a memory controller 418 and a Host central processing unit (CPU) 430. The NMP DIMM 400 may additionally include a PHY interface 420 to interface with the host memory controller 418, the memory controller 422, a first PHY memory interface 424 connected to a first group of DRAMS 426, and a second PHY memory interface 434 connected to a second group of DRAMS 436.

Figure 5:
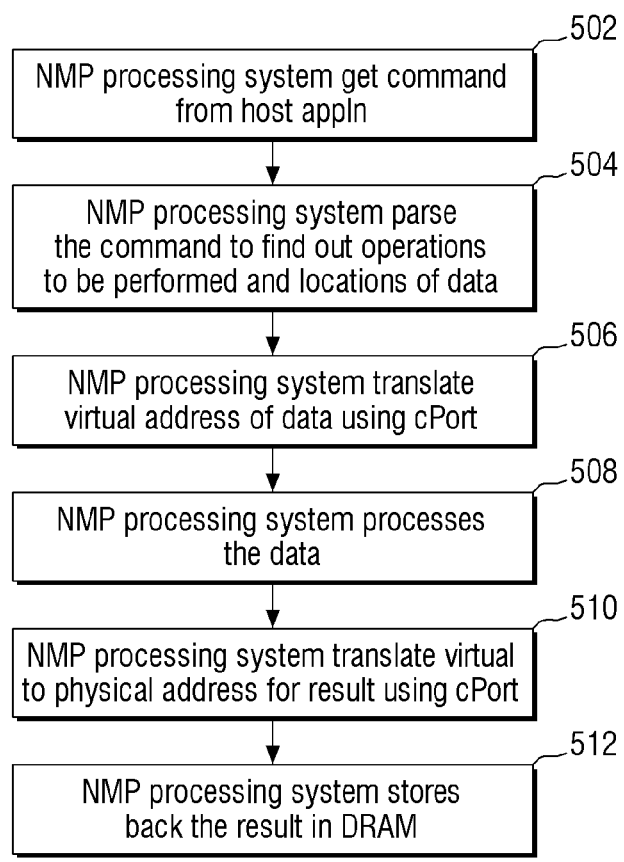
FIG. 5 illustrates method steps in accordance with the description and the embodiment of FIG. 4.

FIG. 5 illustrates method steps in accordance with the description and the embodiment of FIG. 4

At step 502, the NMP processing system receives a command from the host-application. Specifically, the first NMP node 404 within the processing system receives the command from the host system 406.

At step 504, the NMP processing system parses the command to find out operations to be performed and locations of data. More specifically, the first NMP node 404 of the NMP processing system parses the command. The second NMP node 404 determines operations to be performed and locations of data with respect to the parsed command.

At step 506, the NMP processing system translates the virtual address of the data to a physical address using the address translator 414 and the cPort 408. The NMP processing system interacts with the host system 406 using the control port 410 and exchanges control information with the host system 406 in response to the received command.

At step 508, the NMP processing system reads data from the translated physical address and processes the data.

At step 510, the NMP processing system performs a second stage translation as a part of an output operation for rendering results. More specifically, the NMP processing system again performs a virtual to physical-address translation for result using the address translator 414 and the cPort 408.

At step 512, the NMP processing system stores back the result of processed data into DRAM.

Figure 6:
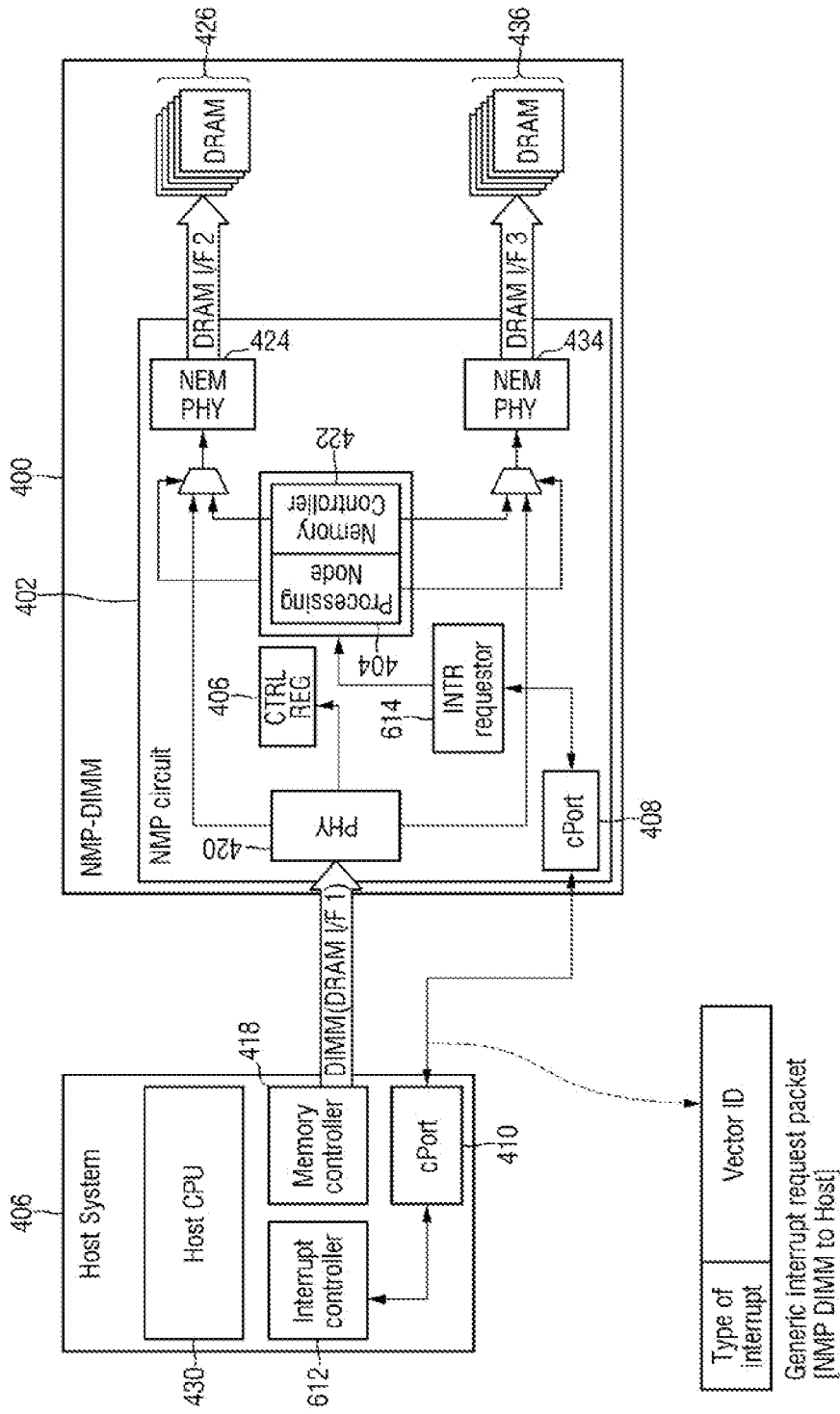
FIG. 6 illustrates a Near Memory Processing (NMP) Dual In-line Memory Module (DIMM) in accordance with an embodiment of the present disclosure.

FIG. 6 illustrates a Near Memory Processing (NMP) Dual In-line Memory Module (DIMM) 400 including a random access memory (RAM) in accordance with an embodiment of the present disclosure. The NMP-DIMM 400 and NMP circuit 402 composition largely corresponds to the embodiment of FIG. 4.

However, the control port 408 interacting with the host system in FIG. 6 enables the NMP circuit 402 to interrupt the host system 406 through an interrupt requestor 614 (e.g., a control circuit) within the NMP circuit 402 and an interrupt controller 612 (e.g., control circuit) within the host system 406. The control port 408 "cPort" (PCIe, CXL, CCIX etc.) is present on device, though which NMP processing system interrupts the host 406 by interacting with the interrupt controller 612.

Referring to FIG. 6, specific information is sent from the first Cport 408 to the second Cport 410 and vice versa to enable the NMP circuit 402 to interrupt the Host System 406. An example of this information as a request response data structure is depicted in FIG. 6 to refer to the types of interrupts supported. The NMP-DIMM 400 may send an interrupt request packet to the Host System 406. The interrupt request packet may include a type and a vector identifier (ID). The type may indicate the type of the interrupt supported. The type of interrupt may be pin based, a message signaled interrupt (MSI), or an enhanced signaled interrupt (MSI-X). The vector ID may identify a particular interrupt that needs to be sent to the host CPU 430.

Once the Host system 406 completes an interrupt service routine in response to receiving the interrupt request packet, it may clear an interrupt pending status bit available on the Cport 408. Accordingly, the Host System 406 is triggered to resume processing after the interrupt.

Figure 7:
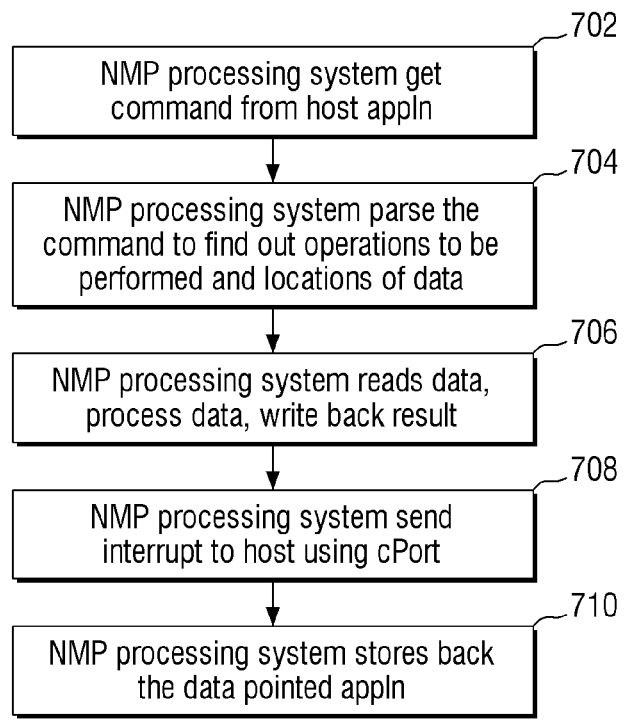
FIG. 7 illustrates method steps in accordance with the embodiment of FIG. 6.

FIG. 7 illustrates method steps in accordance with the embodiment of FIG. 6. Steps 702 and 704 corresponds to steps 502 and 504 of FIG. 5. Step 706 corresponds to an NMP processing system reading data, processing the read data, and writing back a result of the processing. Step 706 may also correspond to the combination of steps 506 till 510. Step 708 corresponds to the NMP processing system sending an interrupt to the host using the cPort 408. More specifically, the NMP processing system interacts by the control port 408 with the host system 406 and enables the NMP nodes 404 to interrupt the host system 406. Step 710 corresponds to step 512 of FIG. 5.

Figure 8:
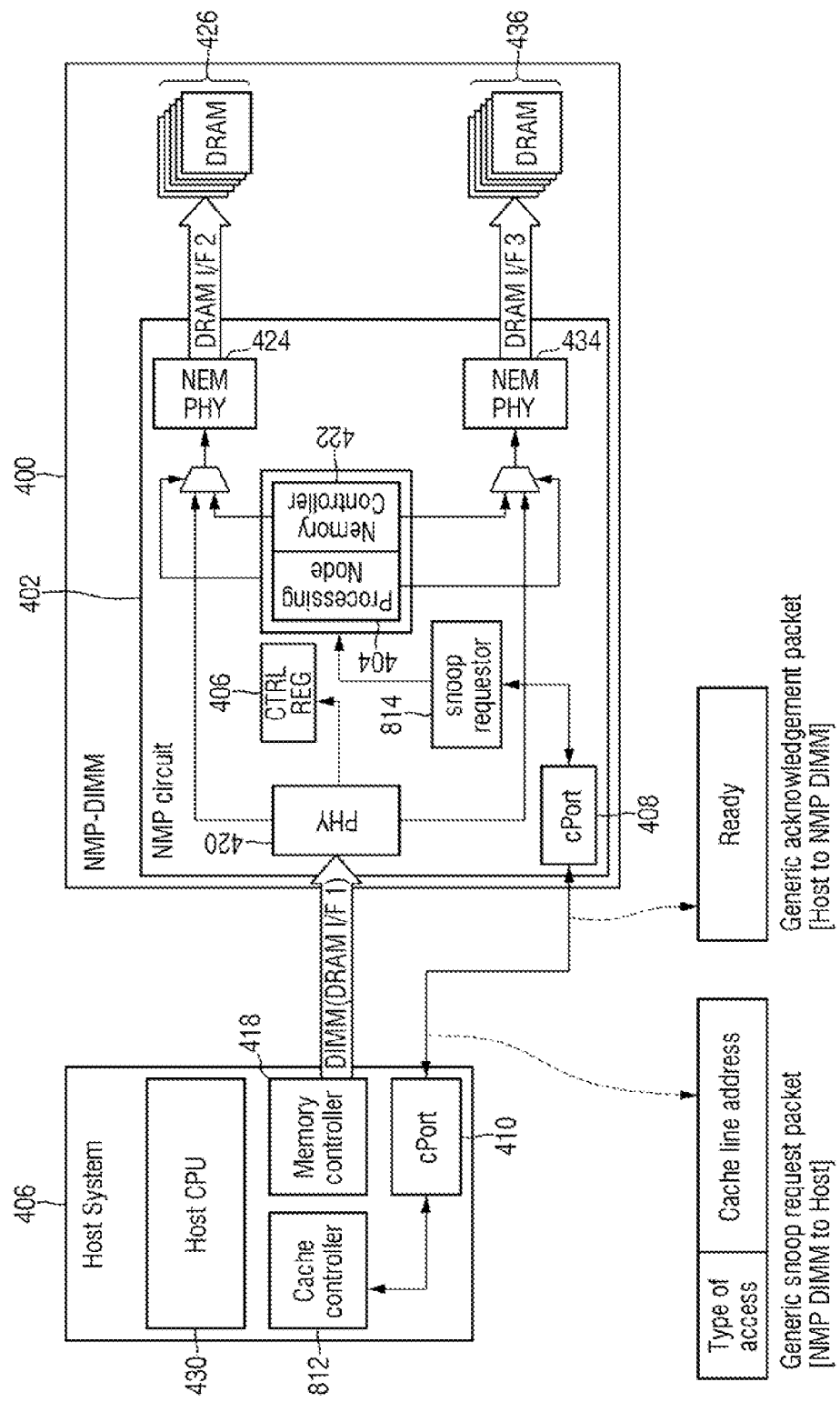
FIG. 8 illustrates a Near Memory Processing (NMP) Dual In-line Memory Module (DIMM) in accordance with an embodiment of the present disclosure.

FIG. 8 illustrates a Near Memory Processing (NMP) Dual In-line Memory Module (DIMM) including a random access memory (RAM) in accordance with an embodiment of the present disclosure. The NMP-DIMM 400 and the NMP circuit 402 composition largely corresponds to the embodiment of FIG. 4 and FIG. 6.

However, the control port 408 interacting with the host system 406 in FIG. 8 enables the NMP circuit to send cache snoop requests to the host system 406 through a snoop requestor 814 and interact with a cache controller 812 to access data in a cache-coherent manner. The control port "cPort" (CXL, CCIX etc.) is present on device, though which NMP processing system operates to remotely interrupt the host and sending control requests for interacting with the cache controller 812. The snoop requestor 814 differs from the interrupt requestor 614 as snoop requests can be communicated to a host in different packet formats. There are different types of packets for interrupts, snoop, address translation for usage by the NMP-DIMM 400.

Referring to FIG. 8, information is sent from the first Cport 408 to the second Cport 410 and vice versa, which enables the NMP circuit 402 to perform a snoop of a cache of the Host System 406. An example of a cache snoop request and acknowledgment is shown in FIG. 8. The NMP-DIMM 400 may send a snoop request packet to the Host System 406 and the Host System 406 may respond to the NMP-DIMM 400 with an acknowledgement packet. The snoop request packet may include a type of access and a cache line address. The type of access may indicate whether the NMP-DIMM 400 desires to perform a write or a read of a certain cache line. The cache line address identifies the address of the cache line it desires to access in a coherent manner. The acknowledgement packet may include a status indicating whether the NMP-DIMM 400 is clear to access the cache line or the Host system 406 is ready to allow the NMP-DIMM 400 to access the cache line.

Figure 9:
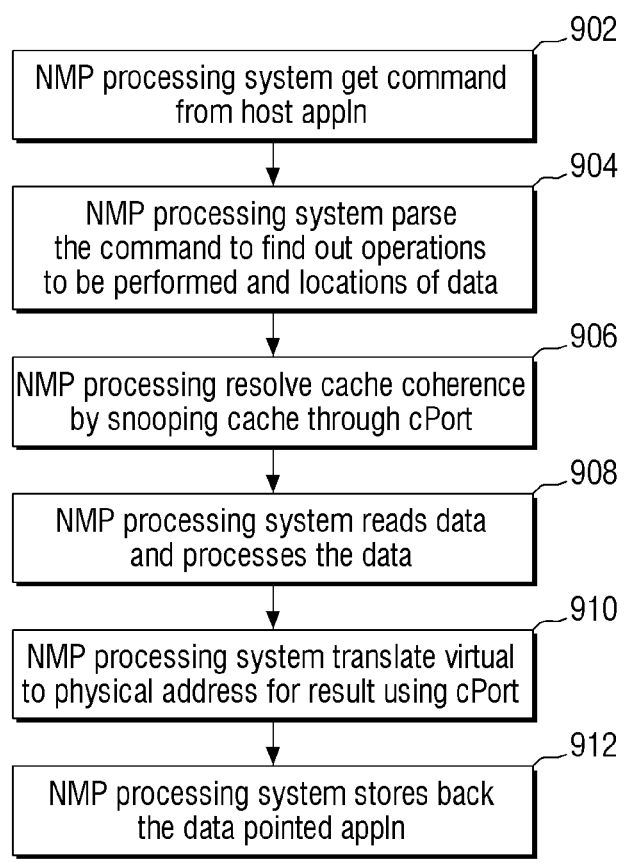
FIG. 9 illustrates method steps in accordance with FIG. 8.

FIG. 9 illustrates method steps in accordance with FIG. 8. Steps 902 and 904 corresponds to steps 502 and 504, 602 and 604. Step 906 depicts the NMP processing system resolving cache coherence by snooping cache through the snoop requestor 814 and control port or the cPort 408. The NMP processing system interacts through the control port 408 with the cache controller 812 in the host system 402 and enables the NMP nodes to access data in a cache coherent manner by snooping a cache of the host system 406 through the cache controller 812. Step 908 to step 912 correspond to the steps 508 to 512 of FIG. 5.

In an implementation, by considering a computer express link (CXL) protocol as a cPort protocol, all of the procedures depicted in FIG. 5, FIG. 7 and FIG. 9 may be executed together through the single NMP-DIMM 400. In other words, the common cPort 408 links the address translator 414, interrupt requestor 614 and snoop requestor 814 of the NMP circuit 402 with the TLB 412, interrupt controller 612 and cache controller 812 forming a part of the host system 406, respectively.

Figure 10:
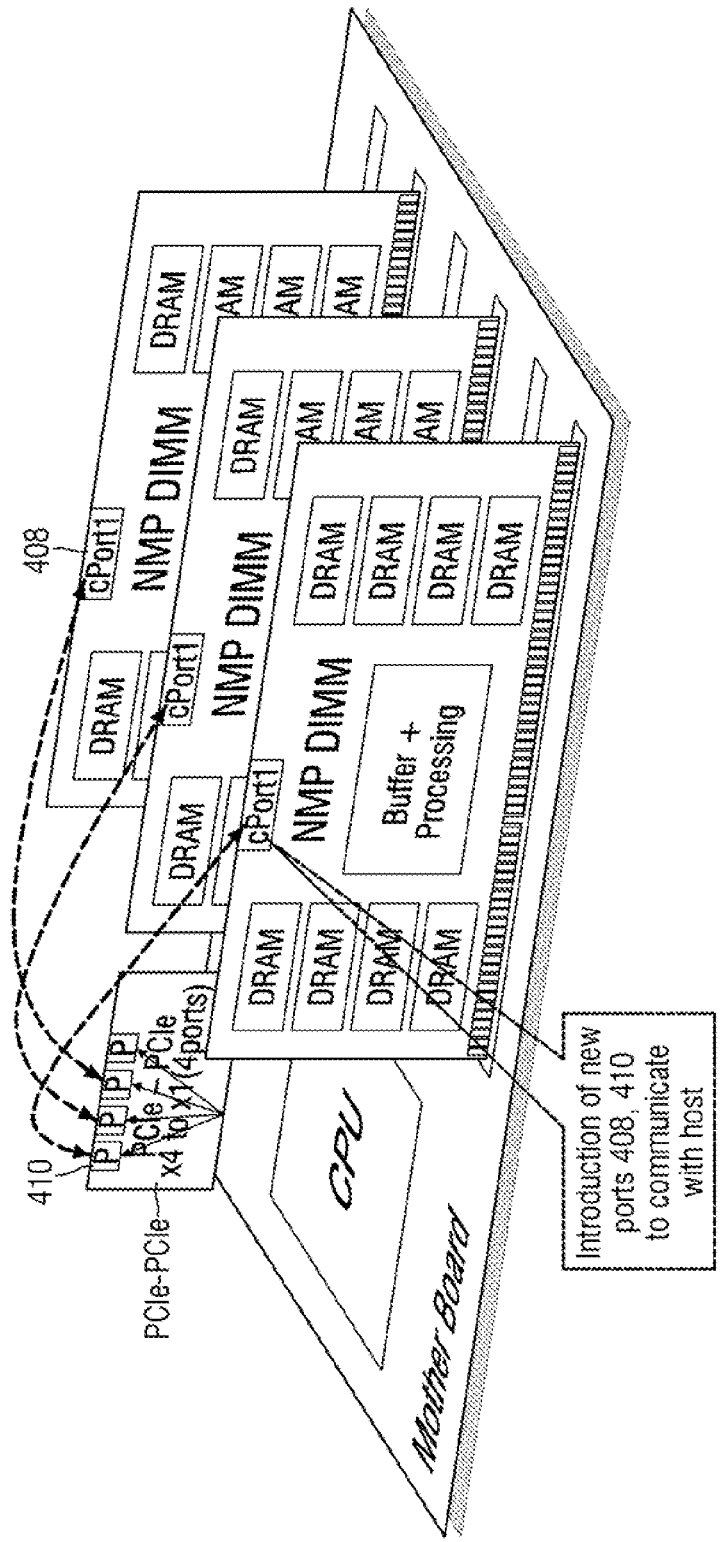
FIG. 10 illustrates a schematic view of NMP-DIMMs in accordance with an embodiment of the present disclosure.

FIG. 10 illustrates a schematic view of NMP-DIMMs 400 connected to host 406 using cPort 408. Multiple NMP-DIMMs 400 can be connected together within a same server. There can be a PCIe-PCIe card which supports multiple ports to connect to a NMP-DIMM. The same refers to a connection splitter or a switch. These ports require a minimal number of lanes and throughput.

Figure 11:
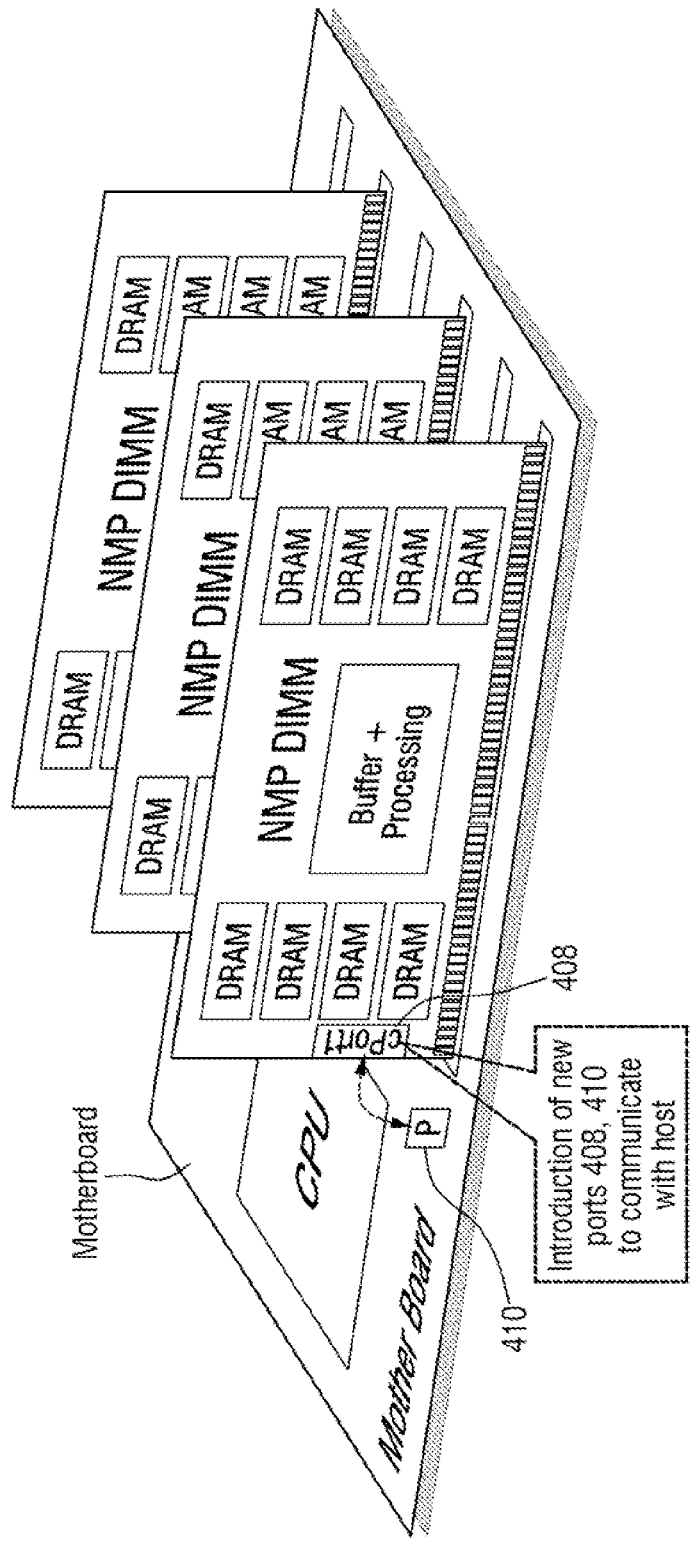
FIG. 11 illustrates another schematic view of NMP-DIMMs in accordance with embodiment of the present disclosure.

FIG. 11 illustrates a schematic view of NMP-DIMMs 400 connected to host 406 using the cPort 408. The port 410 can be embedded on a motherboard.

Figure 12:
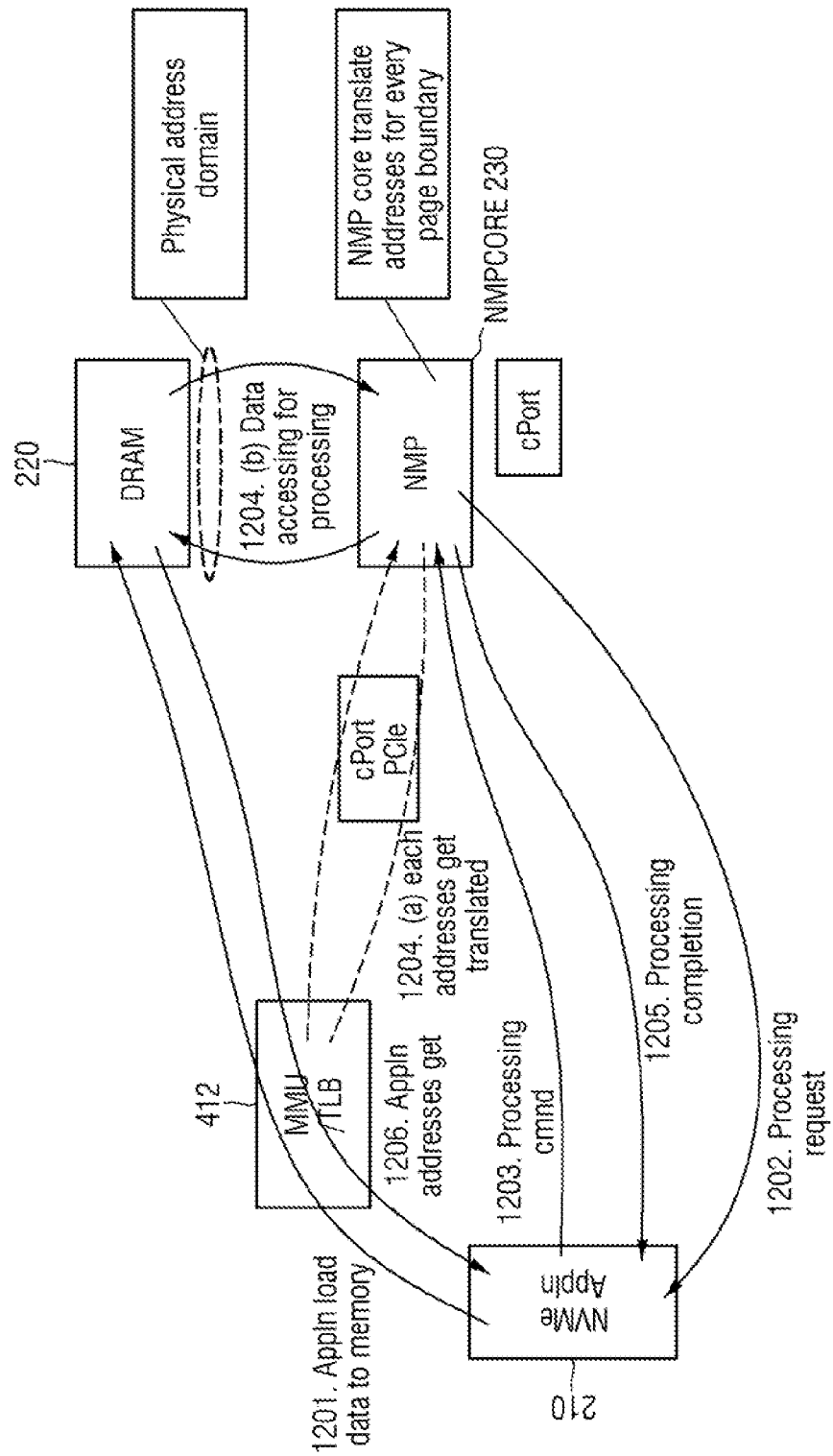
FIG. 12 illustrates an example implementation of address-translation through the NMP-DIMM in accordance with an embodiment of the present disclosure.

FIG. 12 illustrates an example implementation of address-translation through the NMP circuit 402 via the cPort 408 in accordance with an embodiment of the present disclosure.

With respect to the physical address domain in a DRAM, the NMP circuit 402 translates addresses for every page boundary while accessing the TLB 412 of the host system 406 through the control-port using a PCIe connection.

Accordingly, despite the fact that the addresses are generated internally by the NMP circuit 402 based on the processing request, no physical address domain mismatch is observed. Accordingly, the dependency of NMP circuit 402 upon the CPU or a driver for address translation is obviated.

In an NVMe driver based solution for address translation, searching through page tables (i.e. TLB) and extracting physical address may take 10 ms or more. In contrast, through at least one embodiment of the present disclosure, using the cPort 408 based solution, the time taken for a PCIe address translation may be 250 us or less for first-generation (Gen1 x1), and 80 us or for fourth-generation (Gen4 x1) standards.

In an embodiment, the cPort integrated within a DIMM reduces application over head in NMP DIMM operations. The overhead of physical to virtual translation at the host application may be removed and taken care of by the NMP-DIMM without application involvement. Further, polling of registers to determine status of NMP processing by enabling interrupts may also be obviated. As a result, overall application performance may be increased by a certain proportion. In an example, the address translation through the present cPort and PCIe is executed within a substantially less time interval as compared to prior address translations.

In concluding the detailed description, those skilled in the art will appreciate that many variations and modifications may be made to these embodiments without substantially departing from the principles of the present disclosure. Therefore, the disclosed embodiments of the invention are used in a generic and descriptive sense only and not for purposes of limitation

What is claimed is:

1. A Near Memory Processing (NMP) Dual In-line Memory Module (DIMM) comprising:
   a random access memory (RAM);
   a circuit for receiving a command and a virtual address from a host system, determining an operation to be performed on the RAM in response to the command, and determining a location of data within the RAM with respect to the determined operation; and
   a first control port configured to interact with a second control port of the host system,
   wherein the circuit outputs the virtual address from the first control port to the second control port to request that a memory management unit (MMU) of the host system translate the virtual address to a physical address, and
   wherein the circuit determines the location of the data within the RAM using the physical address received from the MMU through the control ports, in response to the request.

2. The NMP DIMM as recited in claim 1, wherein the host system corresponds to a processor executing a host application.

3. The NMP DIMM as recited in claim 1, wherein the first control port includes a first connector connected through a physical wire to a second connector of the second control port.

4. The NMP DIMM as recited in claim 3, wherein the second connector includes at least one of a host adapter connected through a standard connector to the host system and a port embedded within a motherboard of the host system.

5. The NMP DIMM as recited in claim 3, wherein the first connector includes one or more pins provided in a DIMM interface of the NMP DIMM.

6. The NMP DIMM as recited in claim 1, wherein the first control port interacts with the second control port to enable the circuit to interrupt the host system.

7. The NMP DIMM as recited in claim 1, wherein the first control port interacts with the second control port to enable the circuit to access data in a cache coherent manner by snooping a host system cache of the host system.

8. The NMP DIMM as recited in claim 1, wherein the circuit outputs a request packet including the virtual address from the first control port to the second control port connected to the MMU, and the MMU outputs a completion packet including the physical address from the second control port to the first control port, in response to the request packet.

9. A method for performing an operation in a Near Memory Processing (NMP) Dual In-line Memory Module (DIMM) comprising:
    receiving, by a circuit of the NMP DIMM, a command and a virtual address from a host system;
    determining, by the circuit, an operation to be performed on a random access memory (RAM) of the NMP DIMM and a location of data within the RAM with respect to the determined operation; and
    interacting, by a first control port of the circuit with a second control port of the host system,
    wherein the interacting comprises:
        the circuit outputting the virtual address from the first control port to the second control port to request that a memory management unit (MMU) of the host system translate the virtual address to a physical address; and
        the circuit determining the location of the data within the RAM using the physical address received from the MMU through the control ports, in response to the request.

10. The method as recited in claim 9, wherein the host system corresponds to a processor executing a host application.

11. The method as recited in claim 9, wherein the first control port includes a first connector connected through a physical wire to a second connector of the second control port.

12. The method as recited in claim 11, wherein the second connector includes at least one of a host adapter connected through a standard connector to the host system and a port embedded within a motherboard of the host system.

13. The method as recited in claim 11, and wherein the first connector includes one or more pins provided in a DIMM interface of the NMP DIMM.

14. The method as recited in claim 9, further comprising the first control port interacting with the second control port to enable the circuit to interrupt the host system.

15. The method as recited in claim 9, further comprising the first control port interacting with the second control port to enable the circuit to access data in a cache coherent manner by snooping a host system cache of the host system.

16. The method as recited in claim 9, wherein the interacting comprises:
    the circuit outputting a request packet including the virtual address from the first control port to the second control port connected to the MMU; and
    the MMU outputting a completion packet including the physical address from the second control port to the first control port, in response to the request packet.

17. A Near Memory Processing (NMP) Dual In-line Memory Module (DIMM) comprising:
    a random access memory (RAM);
    a first port; and
    a circuit for receiving a command and a virtual address from a host system, determining an operation to be performed on the RAM in response to the command, sending a request including the virtual address from the first port to a second port of the host system connected to a memory management unit (MMU) of the host system to request that the MMU convert the virtual address to a physical address, receiving the physical address at the first port from the second port, and determining a location of data within the RAM using the received physical address.

18. The NMP DIMM recited in claim 17, where the circuit receives the command and virtual address from a PHY interface of the NMP.

19. The NMP DIMM recited in claim 17, wherein the first and second ports are directly connected to one another through a wire.

20. The NMP DIMM recited in claim 17, wherein the first and second ports are PCIe, CXL, or CCIX ports.

* * * * *